United States Patent [19]

Murtland

[11] Patent Number: 4,497,528
[45] Date of Patent: Feb. 5, 1985

[54] AVIONICS CHASSIS INSERTION/EXTRACTION MECHANISM

[75] Inventor: William H. Murtland, Phoenix, Ariz.

[73] Assignee: Sperry Corporation, New York, N.Y.

[21] Appl. No.: 405,839

[22] Filed: Aug. 6, 1982

[51] Int. Cl.³ .......................................... H01R 13/62
[52] U.S. Cl. .............................. 339/45 M; 339/75 M
[58] Field of Search .................................. 339/75, 45

[56] References Cited

U.S. PATENT DOCUMENTS

| | | | |
|---|---|---|---|
| 3,453,586 | 7/1969 | Brenden | 339/75 M |
| 3,534,320 | 10/1970 | Rushing | 339/75 M |
| 3,668,605 | 6/1972 | Albert | 339/75 M |
| 3,830,525 | 8/1974 | Ransford | 339/75 R |
| 4,253,720 | 3/1981 | Crosier | 339/75 M |

FOREIGN PATENT DOCUMENTS 854885 11/1960 United Kingdom .

Primary Examiner—Joseph H. McGlynn
Assistant Examiner—David L. Pirlot
Attorney, Agent, or Firm—Howard P. Terry; Seymour Levine

[57] ABSTRACT

A mechanism for aiding the insertion and extraction of an avionics electronic chassis having a plurality of electrical connectors on to a mounting tray with a corresponding plurality of mating electrical connectors. Levered camming hooks on the chassis, matched with fixed keeper pins on the tray are rotated by a rotary, torque limiting knob and screw arrangement to engage the keeper pins and thereafter pivot thereon. Upon insertion, rotation of the knob applies a limited translational force between the electrical connectors sufficient to effect a full mating of the connectors but insufficient to cause any damage to the connectors should there be any misalignment therebetween. The mechanism has a very short longitudinal profile in its extracted position thereby rendering it useful in restricted spaces. The mechanism further conveniently provides a carrying handle for the chassis.

9 Claims, 7 Drawing Figures

PRIOR ART

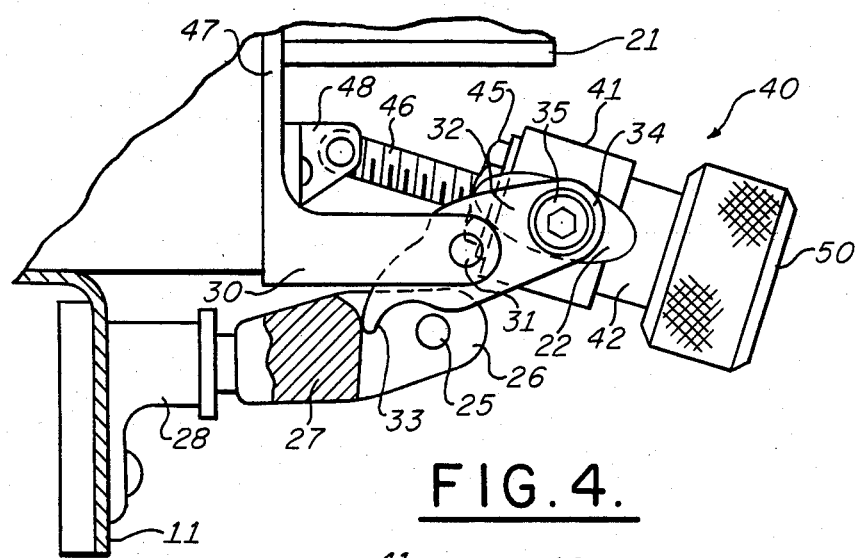
FIG.4.
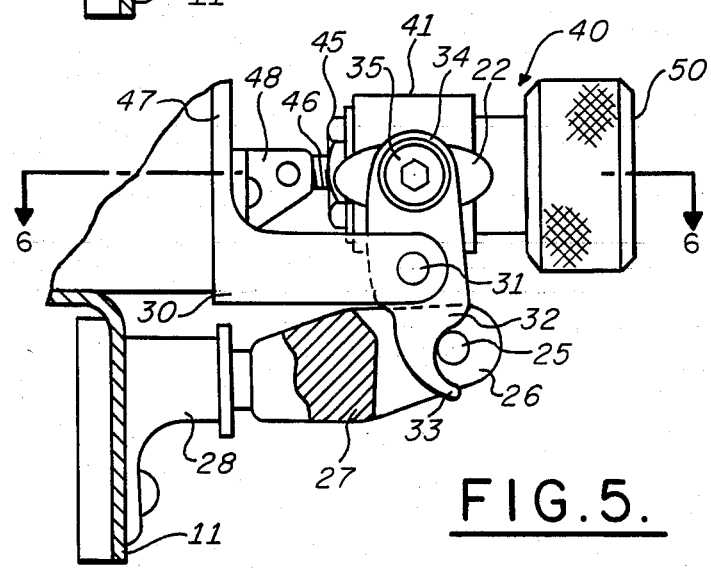
FIG.5.
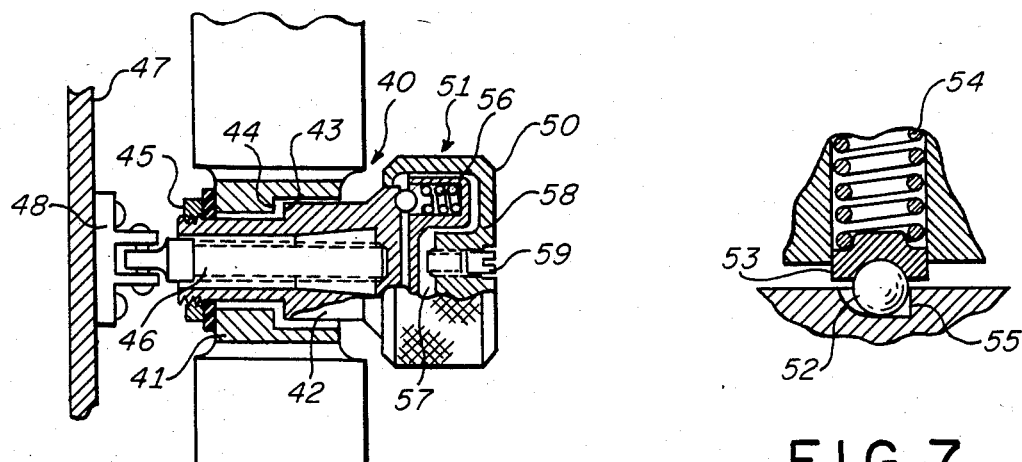
FIG.6.
FIG.7.

AVIONICS CHASSIS INSERTION/EXTRACTION MECHANISM

BACKGROUND OF THE INVENTION

1. Field of the Invention

The present invention relates to insertion/extraction mechanisms for avionics electronic chassis and more specifically to a mechanism which accommodates a large number of electrical connectors and inherently prevents damage to any misaligned connectors and/or the pins thereof. The mechanism further provides a compact longitudinal profile adapting it to use in restricted spaces and, in addition, provides a carrying handle to facilitate portability of the chassis.

2. Description of the Prior Art

As is well known to those skilled in the avionics packaging and installation art, the electronics chassis or electronics box must be capable of being routinely installed and removed for maintenance and/or replacement purposes. Usually, each chassis is mounted on and secured to a tray which in turn is permanently secured to a shelf in the electronics bay or bays of the aircraft. The tray includes at its rear one or more electrical connectors each including a plurality of circuit pin sockets or pins which in turn are connected with the permanent aircraft wiring harnesses. The chassis includes at its rear corresponding electrical connectors and circuit pins or sockets which mate with the tray connectors to electrically interface the chassis circuits with the aircraft wiring. The chassis and tray are rigidly joined together by some form of insertion, extraction and/or holddown devices.

A number of such devices have been devised in the past and a number of these are presently in general use. One of the most common designs involves a pin/hook-/elongated camming lever arrangement (FIG. 1) while another involves a simple lug/screw/wing or knurled nut arrangement (FIG. 2). Two disadvantages are readily apparent in the FIG. 1 prior art arrangement; first, there is no insertion force protection, that is, if the electrical connectors are misaligned and the open levers (usually one on each side of the box) are raised a large closing force applied by the installer may damage the connector and/or its pin; second, the elongated levers in open position greatly increase the overall longitudinal profile of the box thereby requiring a large space in the aircraft electronics bay to effect box installation and removal. Additionally, the box handles prevent the use of extended box volume above the holddown mechanism. It should also be noted that the forces required for the disconnection of the electrical connectors upon extraction of the box from the tray is completely uncontrolled, thereby subjecting the connectors to possible damage upon removal.

The prior art arrangement of FIG. 2 is simply a holddown device with no connector protection and no control or limitation of the longitudinal insertion or extraction forces. As in prior art mechanism of FIG. 1, extraction of the chassis is uncontrolled and may require a manual "wiggling" of the chassis back and forth and up and down to disconnect the electrical connectors which may cause connector and/or pin damage.

SUMMARY OF THE INVENTION

The chassis insertion extraction mechanism of the present invention overcomes the limitations of the prior art and provides a controlled and limited chassis insertion force and unlimited but controlled extraction force to protect against electrical connector damage. Further, the invention provides a reduced overall longitudinal profile thereby adapting the mechanism for use in restricted or cramped areas. These advantages are achieved by means of hooked levers on the chassis that are engageable with fixed keeper pins on the stationary mounting tray. These hooked levers rotate from a non pin-engaging position to a pin-engaging position by means of a rotatable, torque limiting knob and a screw, having an end thereof fixed to the chassis. After the levered hooks engage the tray pins, further rotation of the knob applies a longitudinal translational force on the chassis to move its electrical connectors into contact with the mating connectors on the tray. Continued rotation of the knob increases the insertion force between the individual connector pins and sockets, alignment thereof being assured by tapers on the pins and/or sockets. This force continues to increase until a peak is achieved at which all the pins and sockets of each connector are fully engaged and aligned, whereafter the force reduces as the chassis and connectors become fully inserted. Rotation of the knob beyond the point at which the peak translational force is achieved produces no further translational force on the chassis, thereby protecting misaligned connectors and pins against damage. To extract the chassis from the tray, the knob is rotated in the opposite direction and the reverse of the above occurs, rotation of the knob applying a smooth, controlled translational extraction force on the chassis until the connectors become fully separated. The mechanism is designed so that it becomes a carrying handle for the chassis when removed from the mounting tray.

BRIEF DESCRIPTION OF THE DRAWINGS

A preferred embodiment of the present invention is illustrated in the attached drawings wherein:

FIG. 4 is a side view of the insertion/extraction mechanism in its fully retracted position;

FIG. 5 is a similar view of the mechanism in its fully inserted position;

FIG. 6 is a cross sectional view of the torque limiting clutch associated with the knob of FIGS. 3-5; and FIG. 7 is a detail of a torque limiting clutch of FIG. 6.

DETAILED DESCRIPTION OF THE INVENTION

Figure 3:
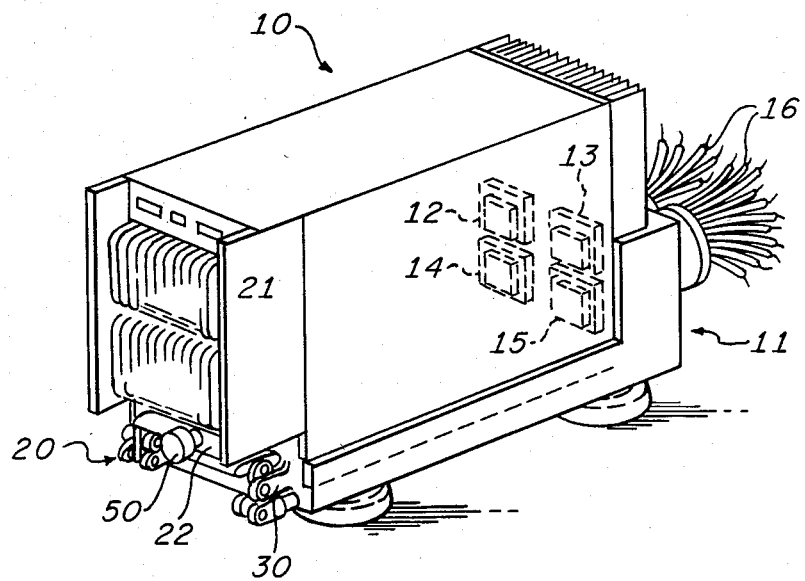
FIG. 3 is a perspective view of the insertion/extraction mechanism of the present invention embodied in a typical avionics electronic chassis which is shown fully inserted into a typical mounting tray.

Referring now to FIG. 3, the avionics electronics chassis member 10 is shown fully inserted into its mounting tray or fixture member 11 which is permanently mounted on a suitable shelf. The chassis and tray may be of conventional design and in the embodiment illustrated include four conventional mating electrical connectors 12, 13, 14, 15, each connector half including a plurality (e.g., as many as 106) of conventional pin and socket wire terminations (not shown). The terminations on the chassis 10 side are connected to the avionics circuits within the chassis while the terminations on the tray 11 are connected to the individual wires of the aircraft harness as generally illustrated at 16 in FIG. 3.

The insertion/extraction mechanism 20 of the present invention is located at the front of the chassis 10 and is illustrated in its fully inserted position and, in sufficient detail to show its overall configuration relative to the chassis and tray. It should be noted that its overall dimensions are such that its elements are confined to the lower portion of the chassis thereby providing useful volume 21 above the mechanism. In the figure forwardly extending cooling fins are shown in this volume. This space, however, may be utilized for additional internal electronics or any other appropriate equipment. It should also be noted that the mechanism in its fully extracted position, does not extend substantially to the chassis outline and in this position provides a convenient carrying handle 22. The details of the mechanism of the present invention are illustrated in detail in FIGS. 4-7.

Referring to FIGS. 4 and 5, the insertion/extraction mechanism includes, adjacent each side of the mounting tray 11, a keeper pin 25 supported by bifurcated arms 26 of keeper lugs 27 secured to the tray 11 by fixed posts 28. These posts may be conventionally adjusted longitudinally if necessary to positively determine the fully inserted or final position of the chassis in the tray as will become evident.

Mounted on and as an integral part of each corresponding side of the chassis 10 are bifurcated extensions or arms 30 which support between them chassis pivot pins 31 for camming and locking levers 32. The lower ends of levers 32 include a hook shaped extension 33 cooperable with keeper pins 25 as will be described. The upper extensions or ends 34 of levers 32 are connected together by an interconnecting member or handle 22 as by means of bolts 35 and tapped holes in the outer ends of the handle member 22. The bolt holes in the upper end of the levers 32 permit relative rotation between the levers and the handle.

Located preferably in the center of the handle member 22 is a rotatably actuated translational movement imparting means or assembly 40 shown in detail in FIG. 6, containing therewithin a rotatably journaled threaded knob supporting cylinder 42 and comprising a cylindrical boss 41, preferably integrally cast with the handle member 22. The cylinder 42 is stepped to provide a shoulder 43 conforming with a corresponding shoulder 44 within the boss 41 to provide one axial thrust surface, while another thrust surface is provided by the end surface of boss 41 and nut 45 threaded and locked on the end of the cylinder 42. Suitable thrust washers such as TEFLON impregnated washers may be used to provide easily rotatable thrust bearing surfaces. Threaded into the knob cylinder 42 is one end of an elongated externally threaded shaft or bolt 46 the other end of which is pivotally secured to the front wall 47 of chassis 10 as by means of a bracket and pin connection 48.

Mounted on the outer end of knob support cylinder 42 is a knurled knob 50 coupled to the cylinder through a one-way torque limiting clutch means 51 which includes generally a resilient detent engaging means associated with the knob 50 and one or more detents associated with the cylinder 42. In the embodiment illustrated in FIG. 7, this clutch consists of a ball 52, ball carrier 53 and ball load spring 54 which axially urges the ball into shaped grooves or slots 55 machined into the outer surface of cylinder 42. A plurality of such balls and grooves may of course be provided. It will be noted that the grooves are so shaped as to provide unlimited or full torque in one direction; i.e., to the right in FIG. 7 and limited torque in the opposite direction. As shown in FIG. 6, the spring and ball carrier is supported in an internal cylindrical clutch member 56 having a hexagonal reentry portion 57 adapted to receive a corresponding hexagonal projection 58 on the knob 50. The cylindrical end of knob 50 is peened over the outer peripheral edge of cylinder 42 to maintain it and the clutch member 56 axially in place and to provide an axial load bearing surface for the detent spring 54. The magnitude of the torque limit may be adjusted by axially positioning the member 56 within the knob as by means of an adjusting screw 59.

The operation of the chassis insertion extraction mechanism of the present invention is now readily apparent. To insert the chassis member 10 into its mounting fixture or tray member 11, the installer makes sure that the translating assembly 40 is in its fully outwardly extended position by rotating the knob 50 in a counterclockwise direction for example, to place the link 32 substantially in a horizontal position. He then slides the chassis into the tray until the surfaces of connectors first touch. This will be the relative position of the chassis and tray illustrated in FIG. 4. Now the installer rotates the knob 50 clockwise through the substantially unloaded clutch 51, causing the bolt 46 to translate boss 41 and handle member 22 toward the chassis wall 47 thereby rotating hooked lever 32 counterclockwise about pin 31 so that the hook 33 engages pin 25. The weight of the chassis of course provides an axial load for the bolt 46. After such pin engagement, continued rotation of knob 50 causes further rotation of the lever 32 but now pivoting about tray keeper pin 25 as its fulcrum thereby translating the chassis 10 through arms 30 to the left as viewed in FIGS. 4 and 5.

When all of the connectors 12-15 and their associated pins are properly aligned, continued rotation of knob 50 produces continued translation of the chassis. As each of the large plurality of pins (in one case as many as 106 pins per connector for a total of 424 pins) enter their respective resilient sockets the required translational force mounts to a peak (in this example as much as 170 lbs.). This peak force therefore determines the torque limit for the clutch 50. After this peak is reached the translational force drops off as the knob is further rotated and translation of the chassis continues to its fully inserted position as illustrated in FIG. 5.

Now assume that one or more of the connectors 12-15 and/or the pins thereof are not properly aligned tending to inhibit further translation of the chassis when the knob 50 is further rotated by the installer. As the torque on knob 50 is increased, torque limit of clutch 51 is exceeded and the ball 52 rises on the ramp surface of groove 55 (FIG. 7) preventing further rotation of cylinder 42. Hence no further translational force can be applied to the chassis, thereby preventing any damage to the misaligned connectors and/or their pins and sockets.

To remove the chassis 10 from the tray 11 the reverse procedure is performed. Note, however, that there is no limit to the amount of torque that can be imparted to the knob 50 due to the perpendicular side of the clutch detent groove 55 rising to or substantially to the horizontal diameter of the ball 52. Thus, and particularly if the chassis has been installed for a long period of time, it may take quite a substantial translational force on the chassis through the knob and bolt to break the seal. Furthermore, it will be noted that the insertion and extraction forces are linear and smooth thereby preventing any damage to the connectors or delicate internal components that might occur by an operator twisting or lifting the chassis to engage or disengage the connectors.

Figure 1:
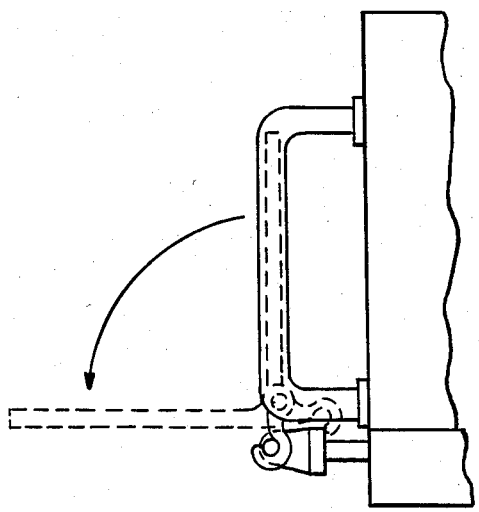
FIGS. 1 and 2 are illustrations of typical prior art mechanisms.
Figure 2:
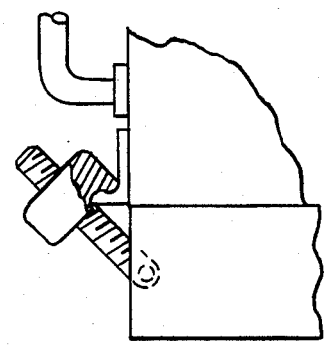

Although but one preferred embodiment of the invention has been illustrated, it will be obvious to those skilled in this art that other embodiments may be readily designed within the scope and teachings thereof. For example, while the knob and lever assembly is shown as attached to the chassis and the keepers attached to the tray, these elements may be reversed, although the carrying handle may be sacrificed. In a further embodiment, the handle, knob and lever mechanism may be removably mounted on the chassis arms 30 by making the pins 31 removable. Thus, the mechanism becomes an insertion and extraction tool for use with any number of chassis installations and removals. In this case conventional holddown mechanisms, such as shown in FIG. 2 may be employed. In a still further embodiment, especially useful for a narrow chassis, only a single keeper 27, arm 30 and lever 32, all mounted at the center of the front of the chassis, need be provided. In such an embodiment, the lever 32 may be lengthened a little and its upper portion may be bifurcated so that the boss 41 may be pivotally mounted therebetween.

While the invention has been described in its preferred embodiment, it is to be understood that the words which have been used are words of description rather than of limitation and that changes may be made within the purview of the appended claims without departing from the true scope and spirit of the invention in its broader aspects.

I claim:

1. A mechanism for inserting and extracting an electronics chassis member having a plurality of electrical connectors into and out of a holding fixture member having corresponding mating connectors, the combination comprising:
    (a) a keeper pin secured to one of said members,
    (b) a pivot pin secured to said member other than said one,
    (c) a lever mounted on said pivot pin, said lever having one end thereof engageable with said keeper pin,
    (d) rotatably actuated translating means with actuating knob means, comprising an externally threaded shaft and a mating internally threaded cylinder said translating means having a part secured to said one member and a part secured to an end of said lever opposite said one end and adapted upon rotation thereof to pivot said lever about said pivot pin to bring said one end of said lever into engagement with said keeper pin and upon continued rotation thereof to pivot said lever about said keeper pin to translate one member relative to another member and effect mating of said electrical connectors, and
    (e) torque limiting clutch means coupled to said translating means for limiting translational force between said members to a predetermined maximum.

2. The mechanism as set forth in claim 1 wherein said torque limiting clutch means includes means for limiting the maximum translational force between said members in but one direction.

3. The mechanism as set forth in claim 1 wherein said electronics chassis and holding fixture are relatively wide and wherein said keeper pin, said pivot pin and said lever are located adjacent outer sides of said chassis and fixture, and wherein an elongated rigid member, having a center whereat said rotatably actuated translating means is secured, interconnects ends of each of said levers.

4. The mechanism as set forth in claim 1 wherein said one member is said electronic chassis member and said other member is said holding fixture member.

5. The mechanism as set forth in claims 1 or 4 wherein said part secured to said one member comprises said threaded shaft and said part secured to said other end of said lever comprises a cylindrical boss for rotatably supporting said internally threaded cylinder.

6. The mechanism as set forth in claim 5 wherein said knob means is rotatably mounted on said threaded cylinder and wherein said torque limiting clutch means is coupled between said knob means and said threaded cylinder.

7. The mechanism as set forth in claim 6 wherein said torque limiting clutch means comprises resilient detent engaging means mounted for rotation with said knob means and cooperable detent means fixed relative to said threaded cylinder, the degree of resiliency of said detent engaging means determining the maximum torque transferable from said knob means to said threaded cylinder.

8. The mechanism as set forth in claim 7 further including adjusting means connected with said detent engaging means for adjusting the resiliency thereof.

9. The mechanism as set forth in claim 8 wherein said resilient detent engaging means includes a spring loaded ball and said cooperable detent includes at least one groove in said threaded cylinder.

* * * * *